United States Patent
Wang et al.

(10) Patent No.: US 10,804,073 B2
(45) Date of Patent: Oct. 13, 2020

(54) APPARATUS AND METHOD FOR LARGE-SCALE HIGH THROUGHPUT QUANTITATIVE CHARACTERIZATION AND THREE-DIMENSIONAL RECONSTRUCTION OF MATERIAL STRUCTURE

(71) Applicant: THE NCS TESTING TECHNOLOGY CO., LTD., Beijing (CN)

(72) Inventors: Haizhou Wang, Beijing (CN); Xing Yu, Beijing (CN); Xuejing Shen, Beijing (CN); Yunhai Jia, Beijing (CN); Xiaojia Li, Beijing (CN); Yuhua Lu, Beijing (CN); Weihao Wan, Beijing (CN); Jianqiu Luo, Beijing (CN); Dongling Li, Beijing (CN); Lei Zhao, Beijing (CN)

(73) Assignee: THE NCS TESTING TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/669,274

(22) Filed: Oct. 30, 2019

(65) Prior Publication Data
US 2020/0294760 A1 Sep. 17, 2020

(30) Foreign Application Priority Data

Mar. 14, 2019 (CN) .......................... 2019 1 0192461

(51) Int. Cl.
*H01J 37/28* (2006.01)
*H01J 37/32* (2006.01)
(Continued)

(52) U.S. Cl.
CPC ............ *H01J 37/222* (2013.01); *H01J 37/20* (2013.01); *H01J 37/28* (2013.01);
(Continued)

(58) Field of Classification Search
CPC .......... H01J 37/20; H01J 37/222; H01J 37/28; H01J 37/3438; H01J 37/32018;
(Continued)

(56) References Cited

U.S. PATENT DOCUMENTS

| 4,366,680 A | 1/1983 | Lovelace et al. |
| 6,472,662 B1 | 10/2002 | Archie |

(Continued)

FOREIGN PATENT DOCUMENTS

| CN | 102829732 A | 12/2012 |
| CN | 103257064 A | 8/2013 |
| CN | 107167474 A | 9/2017 |

OTHER PUBLICATIONS

Brackmann et al, "Glow Discharge Plasma as a Surface Preparation Tool for Microstructure Investigations", Materials Characterization 91 (2014) 76-88 (Year: 2014).*

(Continued)

*Primary Examiner* — David E Smith
(74) *Attorney, Agent, or Firm* — Muncy, Geissler, Olds & Lowe, P.C.

(57) ABSTRACT

An apparatus and method for a large-scale high-throughput quantitative characterization and three-dimensional reconstruction of a material structure. The apparatus having a glow discharge sputtering unit, a sample transfer device, a scanning electron microscope unit and a GPU computer workstation. The glow discharge sputtering unit can achieve large size (cm order), nearly flat and fast sample preparation, and controllable achieve layer-by-layer ablation preparation along the depth direction of the sample surface; rapid scanning electron microscopy (SEM) can achieve large-scale and high-throughput acquisition of sample characteristic maps. The sample transfer device is responsible for transferring the sample between the glow discharge sputtering source and the scanning electron microscope in an (Continued)

accurately positioning manner. The GPU computer workstation performs splicing, processing, recognition and quantitative distribution characterization on the acquired sample characteristic maps, and carries out three-dimensional reconstruction of the structure of the sample prepared by layer-by-layer sputtering.

6 Claims, 4 Drawing Sheets

(51) Int. Cl.
    *H01J 37/22*         (2006.01)
    *H01J 37/34*         (2006.01)
    *H01J 37/20*         (2006.01)

(52) U.S. Cl.
    CPC .... *H01J 37/32018* (2013.01); *H01J 37/3438* (2013.01); *H01J 2237/204* (2013.01); *H01J 2237/208* (2013.01); *H01J 2237/226* (2013.01); *H01J 2237/2814* (2013.01)

(58) Field of Classification Search
    CPC ........... H01J 37/32027; H01J 37/32036; H01J 37/32045; H01J 2237/204; H01J 2237/208; H01J 2237/226; H01J 2237/2814

See application file for complete search history.

(56) References Cited

U.S. PATENT DOCUMENTS

| | | | |
|---|---|---|---|
| 6,667,475 B1 * | 12/2003 | Parran | H01J 37/18 |
| | | | 134/1.1 |
| 2008/0078745 A1 * | 4/2008 | Cordell | H01J 37/16 |
| | | | 216/67 |

OTHER PUBLICATIONS

Tsuji and Shimizu, "SEM Observation of Inclusions in Steel Samples Using Fast Cleaning and Modification of the Surface by Glow Discharge", ISIJ International, vol. 53 Issue 11 p. 1936-1938, 2013 (Year: 2013).*

* cited by examiner

APPARATUS AND METHOD FOR LARGE-SCALE HIGH THROUGHPUT QUANTITATIVE CHARACTERIZATION AND THREE-DIMENSIONAL RECONSTRUCTION OF MATERIAL STRUCTURE

FIELD OF THE INVENTION

The present invention relates to the technical field of material analysis characterization, and in particular relates to an apparatus and method for large-scale high-throughput quantitative characterization and three-dimensional reconstruction of material structure, adopting the combination of glow discharge sputtering and scanning electron microscopy, wherein glow discharge sputtering achieves large size (cm order) sample preparation; rapid scanning electron microscopy can achieve high-throughput acquisition of sample characteristic maps; and the GPU computer workstation performs recognition and quantitative statistical distribution characterization on the characteristic maps, and carries out three-dimensional reconstruction of the maps acquired by the scanning electron microscopy, of the layers of the sample prepared by glow discharge layer-by-layer sputtering.

BACKGROUND OF THE INVENTION

At present, sample preparation techniques for scanning electron microscopy, such as mechanical polishing, electropolishing, focused ion beams (FIBs), etc., have the disadvantages of long time, damage to the sample surface, difficulty in controlling polishing conditions, a small sample preparation area and a high cost, and cannot fully meet the requirement of acquiring overall and real information of a sample.

Glow discharge is low-pressure gas discharge, and as an effective atomization and excitation light source, is often used for elemental analysis of solids. Atoms of the sample are ablated from the surface of the sample by cathode sputtering, then enter into glow discharge plasma and are excited and ionized to form a sputtering pit with a nearly flat bottom on the surface of the sample, which can well satisfy the requirement of sample preparation for scanning electron microscopy. Glow discharge, regardless of a direct current (dc) or radio frequency (rf) light source, can be fast and stable, has a very high depth resolution (up to nm order) and has many applications in the analysis of nano surface layers and composite layers. Moreover, due to the large sputtering area of glow discharge, large-size samples of cm order can be prepared easily; and the ablation rate of sample sputtering is high, which can meet the requirement of fast sample preparation.

A scanning electron microscope (SEM) is one of the most basic and important tools for material structure characterization. Up to now, its characterization objects are still limited to samples smaller than mm order, fields of view smaller than μm order, and two-dimensional planes. Its ability of quantitative characterization of micro-structure such as crystal grains, inclusions, defects and phases is insufficient, which has severely restricted the possibility for the SEM to play a more important role in leading-edge basic research and new material research such as Materials Genomics Engineering (MGI).

Initial attempts for glow discharge as an SEM sample preparation method have started, such as the article "Glow discharge plasma as a surface preparation tool for micro-structure investigations", Materials Characterization, 2014, 91:76-88. The article mentions the use of a commercial glow discharge optical emission spectroscope (GDOES), in which the diameter of its glow sputtering area is only 2.5 mm, and its observation area is several fields of view of the scanning electron microscope, with the drawbacks that its sputtering area is relatively small, and its research area is insufficient random, and the structural conditions of the material cannot be reflected overall in a large-scale range; and since the glow sputtering sample preparation and micro-structure observation are performed by using two separate devices, it is impossible to achieve space coordinates (x, y, z) with positional accuracy and accurate positioning of the sample structure while preparing the sample by layer-by-layer sputtering.

At present, the most commonly used method of three-dimensional reconstruction of material micro-structure is the combination of focused ion beam (FIB) technology and scanning electron microscopy, which can achieve reconstruction of an area of tens of μm order, but has the shortcomings of a small area, changed structure due to the presence of an amorphous layer, and long time (several hours).

SUMMARY OF THE INVENTION

In view of the above technical problems, an objective of the present invention is providing an apparatus for large-scale high-throughput quantitative characterization and three-dimensional reconstruction of material structure, based on sample preparation by glow puttering, acquisition of sample characteristic maps by rapid scanning electron microscopy, map recognition and evaluation by machine learning, layer-by-layer sputtering by glow discharge, and space positions of the layers of structure, to achieve large-area, flat and fast sample preparation; controllable layer-by-layer preparation along the depth direction; space coordinates (x, y, z) with positional accuracy and accurate positioning of the sample structure; large-scale and high-throughput acquisition of sample characteristic maps; splicing, processing, recognition and quantitative statistical distribution characterization on the sample characteristic maps; three-dimensional reconstruction of the sample structure; and the like.

Another objective of the present invention is providing a method for large-scale high-throughput quantitative characterization and three-dimensional reconstruction of material structure.

To achieve the above objectives, the present invention provides a technical solution as follows.

The present invention is based on glow discharge sputtering to achieve large size (cm order), nearly flat and fast sample preparation, and controllable achieve layer-by-layer preparation along the depth direction of the sample surface; rapid scanning electron microscopy can achieve large-scale and high-throughput acquisition of sample characteristic maps; a sample transfer device transfers the sample between the glow discharge sputtering source and the scanning electron microscope in an accurately positioning manner; and a GPU computer workstation performs splicing, processing, recognition and quantitative statistical distribution characterization on the acquired sample characteristic maps, and carries out three-dimensional reconstruction of the structure of the layers of the sample prepared by glow discharge layer-by-layer preparation.

An apparatus for large-scale high-throughput quantitative characterization and three-dimensional reconstruction of material structure adopts the combination of glow discharge sputtering preparation and scanning electron microscopy, the apparatus including a glow discharge sputtering unit 1, a scanning electron microscope unit 2, a sample transfer device 4, and a GPU computer workstation 5.

The glow discharge sputtering unit 1 includes a closed preparing chamber 11 and a vacuuming device, for achieving cm-order large size, nearly flat and fast preparation of a sample 6, and controllable layer-by-layer preparation along the protecting depth direction of the sample 6.

The scanning electron microscope unit 2 includes a closed scanning chamber 21, and an electro-optical system, a signal collection and display system, a vacuum system and a power system arranged within the scanning chamber 21, to perform fast and high-throughput acquisition of characteristic maps of the large-size sample 6 prepared by the glow discharge sputtering unit 1.

The glow discharge sputtering unit 1 is located on a side of the scanning electron microscope unit 2, so that the preparing chamber 11 is horizontally connected to the scanning chamber 21 through a valve 3.

The sample transfer device 4 is arranged within the preparing chamber 11 of the glow discharge sputtering unit 1, located between a sample stage of the glow discharge sputtering unit 1 and a sample stage of the scanning electron microscope unit 2, the sample transfer device 4 includes a mechanical arm which performs accurately transfer of the sample in space coordinate positions between the glow discharge sputtering unit 1 and the scanning electron microscope unit 2.

The GPU computer workstation 5 is connected to the signal collection and display system of the scanning electron microscope unit 2 to acquire high-throughput characteristic maps of the large-size sample 6, perform splicing, processing and recognition on the high-throughput characteristic maps, and carry out quantitative distribution characterization on structural information in the characteristic maps; and perform three-dimensional reconstruction of the sample structure based on space coordinate (x, y, z) information of the characteristic maps.

When the preparing chamber 11 uses the vacuuming device to achieve the same degree of vacuum as the scanning chamber 21, the valve 3 is opened such that the preparing chamber 11 is interconnected with the scanning chamber 21.

In the glow discharge sputtering unit 1, diameter of an anode cylinder of the glow discharge light source is greater than or equal to 1 cm.

The glow discharge sputtering unit 1 further includes follow which arranged within the preparing chamber 11: a glow discharge light source, a DC constant-current energy supply source, an automatic gas path control unit and a sample ejecting device.

A method for large-scale high-throughput quantitative characterization and three-dimensional reconstruction of material structure using the apparatus adopts the combination of glow discharge sputtering preparation and scanning electron microscopy, the method including the following steps:

a. Apparatus Preparation

Working parameters of the glow discharge sputtering unit 1 and the scanning electron microscope unit 2 are set according to detection requirements.

b. Glow Discharge Sputtering Preparation of the Sample

The sample 6 is arranged as a cathode on the sample stage of the glow discharge light source of the glow discharge sputtering unit 1, and uniform sputtering and layer-by-layer ablation are performed on atoms on the surface of the sample 6 in a cathode sputtering manner to achieve glow discharge sputtering preparation of the sample of cm order.

c. Accurate Sample Transfer

During step b, the degree of vacuum of the preparing chamber 11 in the glow discharge sputtering unit 1 is set to be same as that of the scanning chamber 21 in the scanning electron microscope unit 2 through the vacuuming device, and the valve 3 is opened such that the preparing chamber 11 is interconnected with the scanning chamber 21.

After the large-size sample 6 is prepared by the glow discharge sputtering unit 1 each time, the mechanical arm of the sample transfer device 4 transfers the prepared sample 6 from the sample stage of the glow discharge sputtering unit 1 to the sample stage of the scanning electron microscope unit 2 in an accurately positioning manner for the next step d of acquisition of full-size characteristic maps of the sample; after the characteristic maps of the sample 6 are acquired by the scanning electron microscope unit 2, the mechanical arm of the sample transfer device 4 transfers the sample 6 back to the sample stage of the glow discharge sputtering unit 1, and step b is repeated for glow discharge sputtering preparation of the next layer of sample surface, and the process is repeated in this way.

d. Acquisition of Full-Size Characteristic Maps of the Sample

The scanning electron microscope unit 2 acquires the full-size characteristic maps of the sample using a high-throughput scanning electron microscope based on all-electronic direct detection technology in combination with a high-speed accurate nano platform and distortionless scanning electron microscope objective technology.

e. Quantitative Statistical Distribution Characterization and Three-Dimensional Reconstruction The GPU computer workstation 5 acquires the high-throughput characteristic maps of the large-size sample 6 from the scanning electron microscope unit 2, performs splicing of the high-throughput characteristic maps, automatically recognizes the sample characteristic maps by means of machine learning to acquire micro-structure information of the sample in the space coordinates, and carries out quantitative statistical distribution analysis characterization; and performs three-dimensional reconstruction of the sample structure through layer-by-layer sputtering in a glow discharge controllable condition and acquisition of the space coordinates of the maps of the layers.

In step c, the positioning precision between an upper layer and a lower layer is 100 nm.

In step e, a slight positioning deviation which is present between the upper layer and the lower layer, and positions in the acquired images are recalibrated using computer software.

Compared with the prior art, the present invention has the following beneficial effects:

In the present invention, fast and flat preparation of a large size (cm order) sample can be achieved, and the sample can be prepared controllably layer-by-layer without damage to the structure of the sample, at a low cost; full-sample collection of characteristic maps of the sample can be achieved in a high-throughput manner; and structural information of the characteristic maps of the sample is automatically spliced, processed and recognized, and space coordinates (x, y, z) in a large-scale range and quantitative statistical distribution characterization information and three-dimensional reconstruction of micro-structure such as crystal grains, inclusions, defects, and phases of the sample corresponding thereto precisely are provided.

Figure 1:
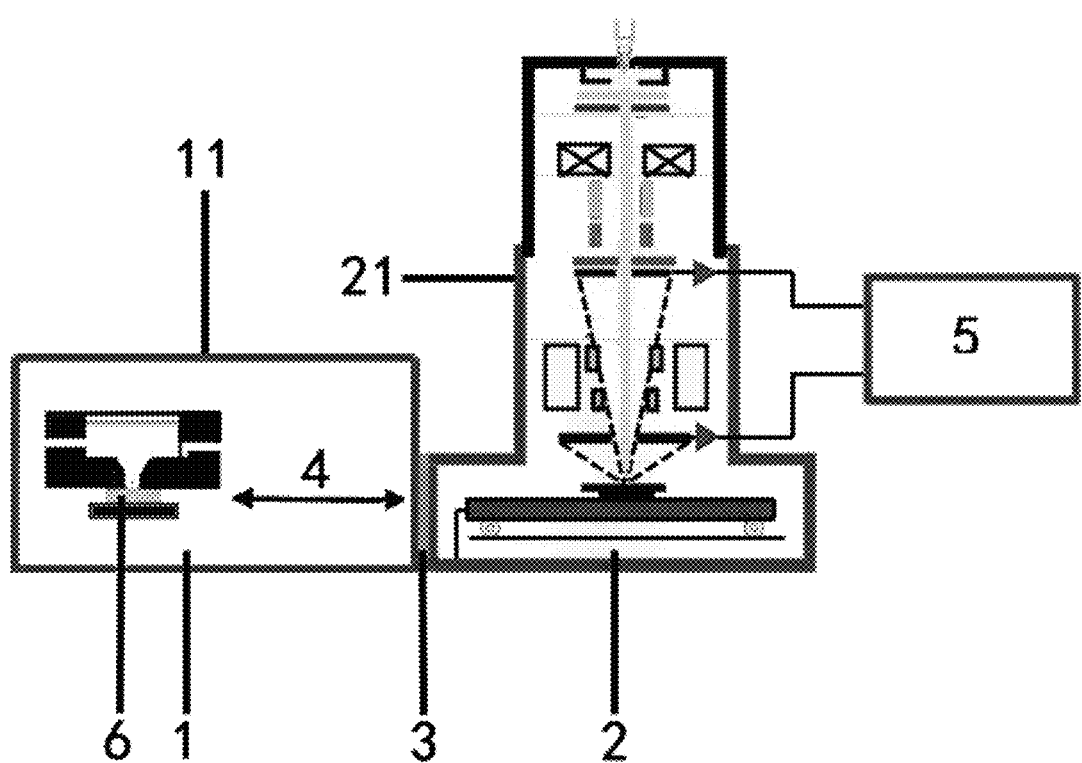
FIG. 1 is a structure diagram of an apparatus for large-scale high-throughput quantitative characterization and three-dimensional reconstruction of material structure in the present invention.

LIST OF REFERENCE NUMERALS 1 glow discharge sputtering unit
11 preparing chamber
2 scanning electron microscope unit
21 scanning chamber
3 valve
4 sample transfer device
5 GPU computer workstation
6 sample

DETAILED DESCRIPTION OF THE EMBODIMENTS

The present invention will be further described in conjunction with the accompanying drawings and the embodiments.

As shown in FIG. 1, an apparatus for large-scale high-throughput quantitative characterization and three-dimensional reconstruction of material structure includes a glow discharge sputtering unit 1, a sample transfer device 4, a scanning electron microscope unit 2 and a GPU computer workstation 5.

The glow discharge sputtering unit 1 includes a closed preparing chamber 11 and a vacuuming device, and a glow discharge light source, a DC constant-current energy supply source, an automatic gas path control unit and a sample ejecting device arranged within the preparing chamber 11, for achieving cm-order large scale, nearly flat and fast preparation of a sample 6, and controllable layer-by-layer preparation along the protecting depth direction of the sample 6.

The scanning electron microscope unit 2 includes a closed scanning chamber 21, and an electro-optical system, a signal collection and display system, a vacuum system and a power system arranged within the scanning chamber 21, for fast and high-throughput acquisition of characteristic maps of the large-size sample 6 prepared by the glow discharge sputtering unit 1.

The preparing chamber 11 is horizontally connected to the scanning chamber 21 through a valve 3, wherein when the preparing chamber 11 uses the vacuuming device to achieve the same degree of vacuum as the scanning chamber 21, the valve 3 is opened such that the preparing chamber 11 is interconnected with the scanning chamber 21.

The sample transfer device 4 is arranged within the preparing chamber 11 of the glow discharge sputtering unit 1 and located between a sample stage of the glow discharge sputtering unit 1 and a sample stage of the scanning electron microscope unit 2, and the sample transfer device 4 includes a mechanical arm, so that the sample can be transferred accurately in space coordinate positions between the glow discharge sputtering unit 1 and the scanning electron microscope unit 2; and during the layer-by-layer sputtering process, this ensures high repeatability of each layer preparation and map acquisition in the space coordinate positions of the glow discharge sputtering unit and the scanning electron microscope unit to facilitate three-dimensional reconstruction of the sample structure.

The GPU computer workstation 5 is connected to the signal collection and display system of the scanning electron microscope unit 2 to acquire high-throughput characteristic maps of the large-size sample 6, perform splicing, processing and recognition on the high-throughput characteristic maps, and carry out quantitative distribution characterization on structural information in the characteristic maps; and perform three-dimensional reconstruction of the sample structure based on space coordinate (x, y, z) information of the characteristic maps.

A method for large-scale high-throughput quantitative characterization and three-dimensional reconstruction of material structure, using the apparatus for large-scale high-throughput quantitative characterization and three-dimensional reconstruction of material structure, including the following steps:

a. Apparatus Preparation

Working parameters of the glow discharge sputtering unit 1 and the scanning electron microscope unit 2 are set according to detection requirements;

b. Glow Discharge Sputtering Preparation of the Sample

The sample 6 is arranged as a cathode on the sample stage of the glow discharge light source of the glow discharge sputtering unit 1; the sample ejecting device pushes the sample 6 into contact with a cathode disc on the glow discharge light source; a seal ring on the cathode disc enables the sample 6 and a chamber of the glow discharge light source to form a closed discharge space, which is filled with a discharge gas (such as argon) and pumped by a vacuum pump at the same time to achieve a dynamic balance, wherein the gas pressure is maintained at about 1 Torr; an anode cylinder with a large diameter ($\geq 1$ cm) is used, with a sufficiently high voltage applied between the two electrodes, generally 500-2000V, to result in glow discharge; discharge gas ions (such as argon ions) arrive at the surface of the sample 6 under the accelerating effect of the electric field to perform uniform sputtering and layer-by-layer ablation on atoms on the surface of the sample in a cathode sputtering manner to achieve glow discharge sputtering preparation of the sample of cm order.

c. Accurate Sample Transfer

During step b, the degree of vacuum of the preparing chamber 11 of the glow discharge sputtering unit 1 is set to be same as that of the scanning chamber 21 of the scanning electron microscope unit 2 through the vacuuming device, and the valve 3 is opened such that the preparing chamber 11 is communicated with the scanning chamber 21.

after the large-size sample 6 is prepared by the glow discharge sputtering unit 1 each time, the mechanical arm of the sample transfer device 4 transfers the prepared sample 6 from the sample stage of the glow discharge sputtering unit 1 to the sample stage of the scanning electron microscope unit 2 in an accurately positioning manner for the next step d of acquisition of full-size characteristic maps of the sample; after the characteristic maps of the sample 6 are acquired by the scanning electron microscope unit 2, the mechanical arm of the sample transfer device 4 transfers the sample 6 back to the sample stage of the glow discharge sputtering unit 1, and step b is repeated for glow discharge sputtering preparation of the next layer of sample surface, and the process is repeated in this way.

d. Acquisition of Full-Size Characteristic Maps of the Sample

In the scanning electron microscope unit 2, electron beams emitted by an electron gun are subjected to electrostatic focusing by a grid electrode and passes though 2-3 electromagnetic lenses under an accelerating voltage of 2-30 KV, and the electron beams can converge into electron beams with a small aperture angle and beam spots of 5-10 nm and are focused on the surface of the sample 6; in addition, the final lens is installed with a scanning coil, under the action of which the electron beams performs scanning on the sample surface; and the full-size characteristic maps of the sample are acquired using a high-throughput scanning electron microscope based on all-electronic direct detection technology in combination with a high-speed accurate nano platform and distortionless scanning electron microscope objective technology.

e. Quantitative Statistical Distribution Characterization and Three-Dimensional Reconstruction The sample characteristic maps acquired by the scanning electron microscope unit 2 can be transmitted via a cable to the GPU computer workstation 5 for the next step of processing; a large quantity of sample characteristic maps are spliced; the sample characteristic maps are automatically recognized by means of machine learning to acquire microstructure information of the sample in the space coordinates, and quantitative statistical distribution analysis characterization is carried out thereon; and three-dimensional reconstruction of the sample structure is performed through layer-by-layer sputtering in a glow discharge controllable condition and acquisition of the space coordinates of the maps of the layers.

EMBODIMENT

In the method for large-scale high-throughput quantitative characterization and three-dimensional reconstruction of material structure, using the apparatus for large-scale high-throughput quantitative characterization and three-dimensional reconstruction of material structure, a nickel-based single crystal superalloy sample is subjected to large-size sample preparation, high-throughput acquisition of characteristic maps, and quantitative statistical distribution characterization and three-dimensional reconstruction of the micro-structure. The operation steps are as follows:

(1) The units are interconnected to each other in the manner described above, the power supply is turned on, a vacuum chamber is vacuumized, the apparatus is preheated stably, and the instrument parameters are set: the discharge voltage, discharge current, sputtering time and the like of glow discharge sputtering; and the working voltage, working distance, magnification and the like of scanning electron microscopy.

Figure 2:
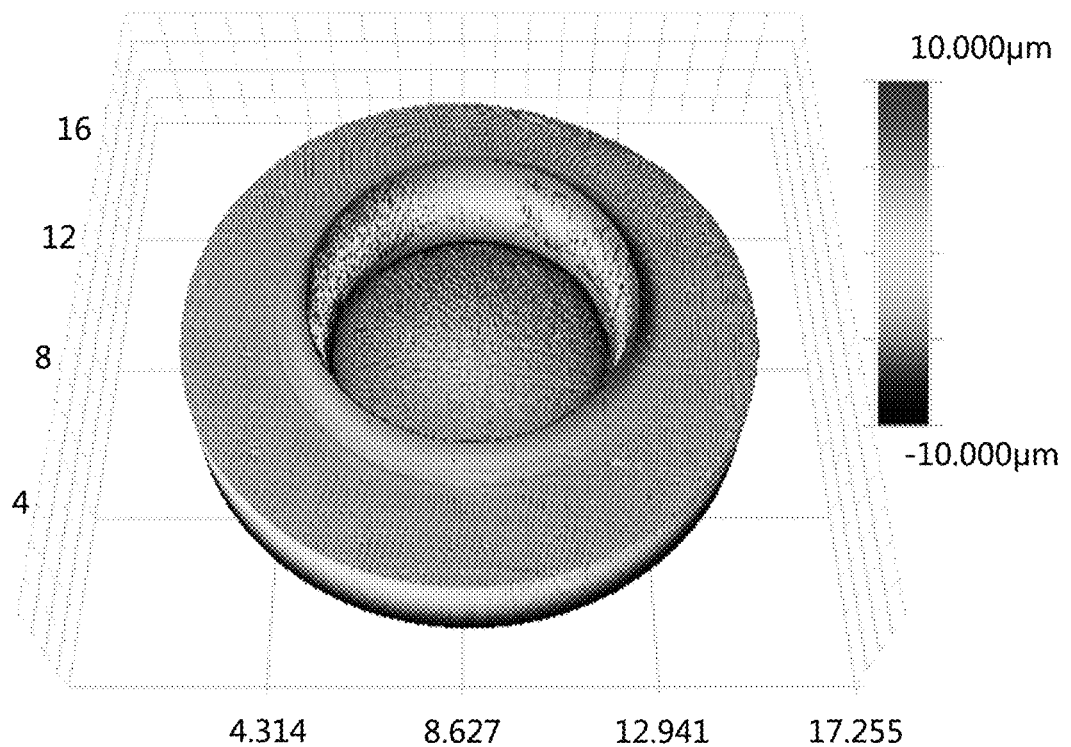
FIG. 2 is a pit shape formed by glow discharge sputtering sample preparation through white light interferometry in the present invention.

(2) The sample is put into the glow discharge sputtering unit, the glow discharge sputtering unit is vacuumized and a discharge gas of a set gasflow is introduced therein; after the gas pressure reaches a balance, a set discharge voltage is applied to start glow to achieve sputtering preparation of the sample through glow discharge plasma, wherein the surface pit shape of sample prepared by glow sputtering is shown in FIG. 2.

(3) During preparation by glow discharge sputtering, the chamber of the glow discharge sputtering unit is vacuumized by the vacuum pump, and when its degree of vacuum reaches that of the chamber of the scanning electron microscope unit, the valve 3 between the two chambers is opened; and the mechanical arm of the sample transfer device transfers the sample prepared by glow discharge sputtering to the sample stage of the scanning electron microscope for scanning electron microscope analysis.

Figure 3:
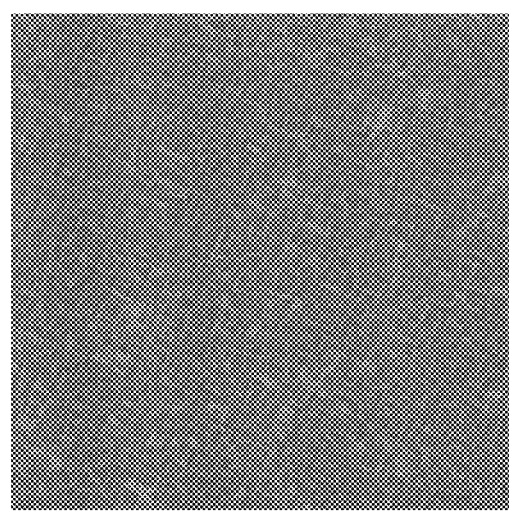
FIG. 3 is a partial backscattering image by a scanning electron microscope (a 10,000-fold magnification, nickel-based single crystal superalloy) in the sample preparation by glow discharge sputtering in the present invention.

(4) The scanning electron microscope emits electron beams for scanning the sample surface in set experiment conditions, to acquire a secondary electron image and a backscattered image of the sample (FIG. 3) respectively.

Figure 4:
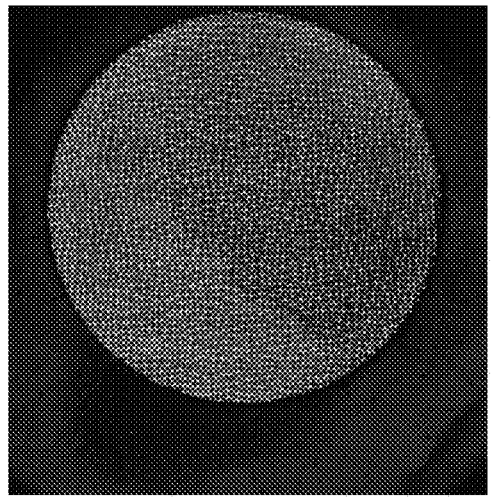
FIG. 4 shows recognition of characteristic maps acquired by the scanning electron microscope in the present invention (cross dendrites in a nickel-based single crystal superalloy)
Figure 5A:
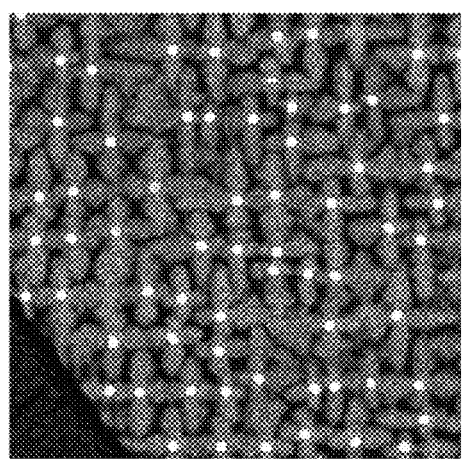
FIG. 5a shows image recognition of dendrites of a nickel-based single crystal superalloy by the scanning electron microscope in the present invention.
Figure 5B:
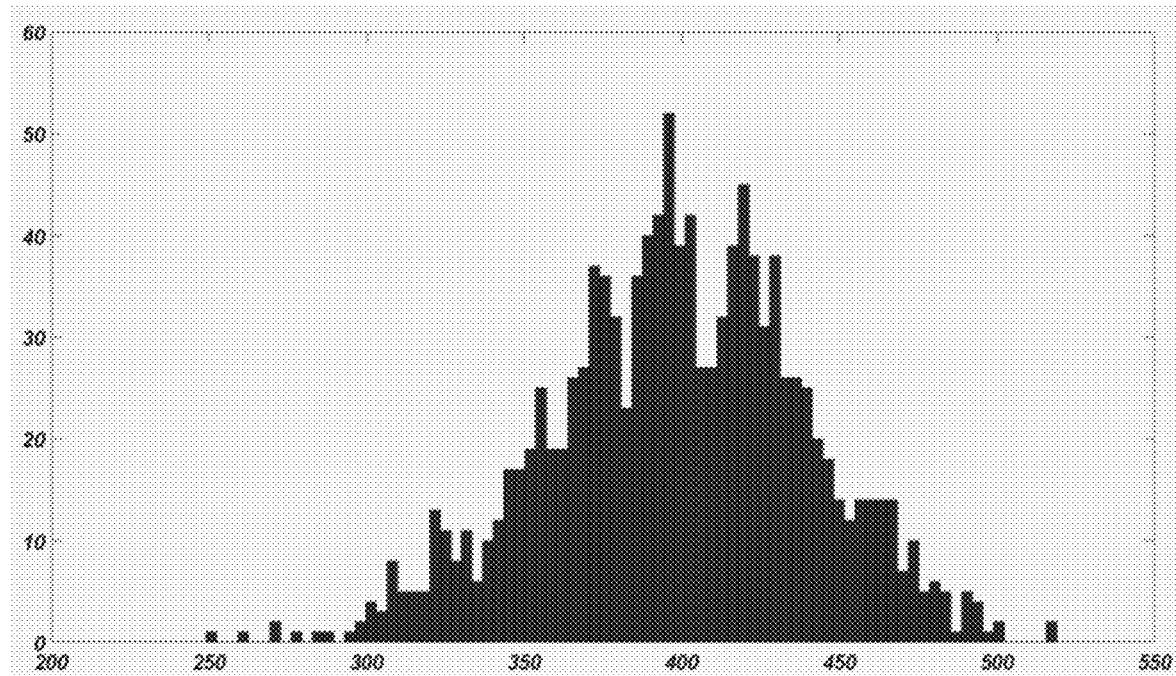
FIG. 5b quantitative statistical distribution characterization of the dendrite spacing of the nickel-based single crystal superalloy in the present invention.
Figure 6:
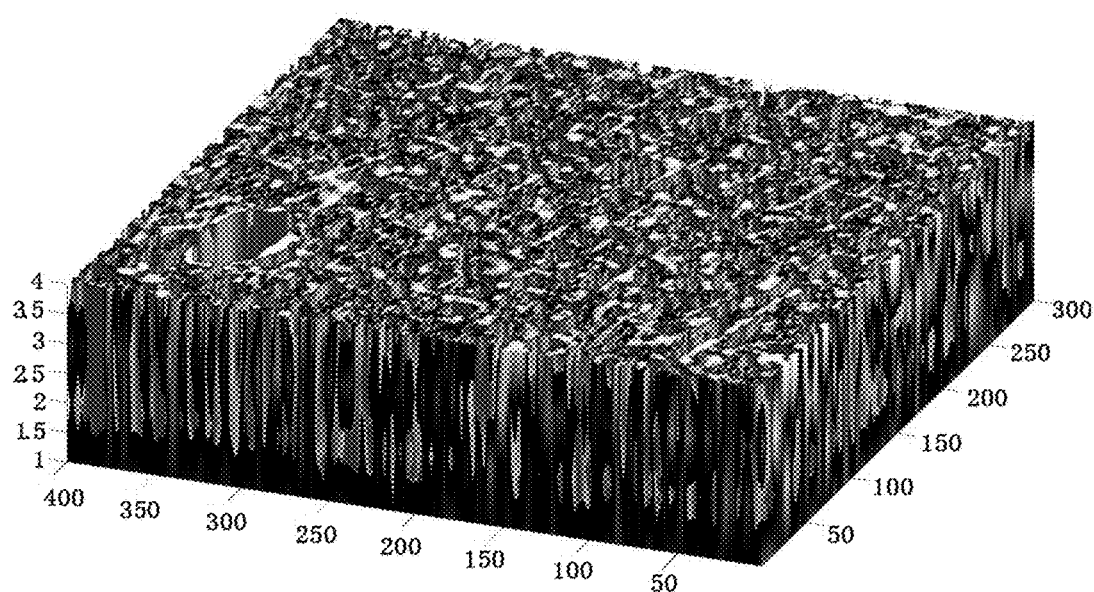
FIG. 6 shows a three-dimensional reconstruction diagram of the sample structure in the present invention (nickel-based single crystal superalloy).

(5) Cross dendrites of the acquired characteristic maps are recognized by the GPU computer workstation by means of machine learning (FIG. 4); quantitative statistical distribution characterization is carried out on relevant parameters of the cross dendrites, such statistics on the dendritic spacing (FIGS. 5a and 5b); and three-dimensional reconstruction is performed on the maps of the layers (FIG. 6).

Described above are only preferred embodiments of the present invention, which are not intended to limit the present invention. All modifications, equivalent substitutions, improvements and the like made within the spirit and principle of the present invention shall be encompassed within the protection scope of the present invention.

The invention claimed is:

1. An apparatus for large-scale high-throughput quantitative characterization and three-dimensional reconstruction of material structure, adopting the combination of glow discharge sputtering sample preparation and scanning electron microscopy, the apparatus comprising a glow discharge sputtering unit, a scanning electron microscope unit, a sample transfer device, and a GPU computer workstation, wherein the glow discharge sputtering unit comprises a closed preparing chamber and a vacuuming device, for achieving cm-order large scale, nearly flat and fast preparation of a sample, and controllable layer-by-layer preparation along the protecting depth direction of the sample;

the diameter of an anode cylinder of the glow discharge sputtering unit is greater than or equal to 1 cm;

the scanning electron microscope unit comprises a closed scanning chamber, and an electro-optical system, a signal collection and display system, a vacuum system and a power system arranged within the scanning chamber, for fast and high-throughput acquisition of characteristic maps of the large-size sample prepared by the glow discharge sputtering unit;

the glow discharge sputtering unit is located on a side of the scanning electron microscope unit, so that the preparing chamber is horizontally connected to the scanning chamber through a valve;

the sample transfer device is arranged within the preparing chamber of the glow discharge sputtering unit and located between a sample stage of the glow discharge sputtering unit and a sample stage of the scanning electron microscope unit, and the sample transfer device comprises a mechanical arm to transfer the sample accurately in space coordinate positions between the glow discharge sputtering unit and the scanning electron microscope unit; and the GPU computer workstation is connected to the signal collection and display system of the scanning electron microscope unit to acquire high-throughput characteristic maps of the large-size sample, perform splicing, processing and recognition on the high-throughput characteristic maps, and carry out quantitative distribution characterization on structural information in the characteristic maps; and perform three-dimensional reconstruction of the sample structure based on space coordinate information of the characteristic maps.

2. The apparatus of claim 1, wherein when the preparing chamber uses the vacuuming device to achieve the same degree of vacuum as the scanning chamber, the valve is opened such that the preparing chamber is interconnected with the scanning chamber.

3. The apparatus of claim 1, wherein the glow discharge sputtering unit further comprises a DC constant-current energy supply source, an automatic gas path control unit and a sample ejecting device arranged within the preparing chamber.

4. A method for large-scale high-throughput quantitative characterization and three-dimensional reconstruction of material structure using the apparatus of claim 1, adopting the combination of glow discharge sputtering preparation and scanning electron microscopy, the method comprising the following steps:

a. an apparatus preparation step, comprising:

setting working parameters of the glow discharge sputtering unit and the scanning electron microscope unit according to detection requirements;

b. a glow discharge preparation of the sample step, comprising:

arranging the sample as a cathode on the sample stage of the glow discharge light source of the glow discharge sputtering unit, and performing uniform sputtering and layer-by-layer ablation on atoms on the surface of the sample in a cathode sputtering manner to achieve glow discharge sputtering preparation of the sample of cm order;

c. an accurate sample transfer step, comprising:

during step b, setting the degree of vacuum of the preparing chamber of the glow discharge sputtering unit to be same as that of the scanning chamber of the scanning electron microscope unit through the vacuuming device, and opening the valve such that the preparing chamber is communicated with the scanning chamber;

after the large-size sample is prepared by the glow discharge sputtering unit each time, the mechanical arm of the sample transfer device transferring the prepared sample from the sample stage of the glow discharge sputtering unit to the sample stage of the scanning electron microscope unit in an accurately positioning manner for the next step d of acquisition of full-size characteristic maps of the sample; after the characteristic maps of the sample are acquired by the scanning electron microscope unit, the mechanical arm of the sample transfer device transferring the sample back to the sample stage of the glow discharge sputtering unit, and repeating step b for glow discharge sputtering preparation of the next layer of sample surface, and repeating the process in this way;

d. an acquisition of full-size characteristic maps of the sample step, comprising:

the scanning electron microscope unit acquires the full-size characteristic maps of the sample using a high-throughput scanning electron microscope based on all-electronic direct detection technology in combination with a high-speed accurate nano platform and distortionless scanning electron microscope objective technology;

e. a quantitative statistical distribution and three-dimensional reconstruction step, comprising:

the GPU computer workstation acquiring the high-throughput characteristic maps of the large-size sample from the scanning electron microscope unit, performing splicing on the high-throughput characteristic maps, automatically recognizing the sample characteristic maps by means of machine learning to acquire micro-structure information of the sample in the space coordinates, and carrying out quantitative statistical distribution analysis characterization; and performing three-dimensional reconstruction of the sample structure through layer-by-layer sputtering in a glow discharge controllable condition and acquisition of the space coordinates of the maps of the layers.

5. The method for large-scale high-throughput quantitative characterization and three-dimensional reconstruction of material structure of claim 4, wherein in step c, the positioning precision between an upper layer and a lower layer is 100 nm.

6. The method for large-scale high-throughput quantitative characterization and three-dimensional reconstruction of material structure of claim 4, wherein in step e, a slight positioning deviation is present between the upper layer and the lower layer, and positions in the acquired images are recalibrated using computer software.

* * * * *